US009342402B1

(12) United States Patent
Ong et al.

(10) Patent No.: US 9,342,402 B1
(45) Date of Patent: May 17, 2016

(54) MEMORY INTERFACE WITH HYBRID ERROR DETECTION CIRCUITRY FOR MODULAR DESIGNS

(71) Applicant: Altera Corporation, San Jose, CA (US)

(72) Inventors: Yu Ying Ong, Ampang (MY); Weizhong Xu, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 146 days.

(21) Appl. No.: 14/166,337

(22) Filed: Jan. 28, 2014

(51) Int. Cl.
G06F 11/10 (2006.01)
G06F 13/16 (2006.01)
G06F 3/06 (2006.01)
G06F 12/00 (2006.01)
G11C 16/10 (2006.01)
G11C 16/26 (2006.01)
G11C 29/04 (2006.01)

(52) U.S. Cl.
CPC ............ *G06F 11/1056* (2013.01); *G06F 3/068* (2013.01); *G06F 3/0658* (2013.01); *G06F 11/10* (2013.01); *G06F 11/1048* (2013.01); *G06F 12/00* (2013.01); *G06F 13/16* (2013.01); *G06F 13/1668* (2013.01); *G06F 13/1673* (2013.01); *G06F 13/1694* (2013.01); *G11C 16/10* (2013.01); *G11C 16/26* (2013.01); *G11C 2029/0411* (2013.01); *Y02B 60/1228* (2013.01)

(58) Field of Classification Search
CPC . G06F 11/1056; G06F 11/1048; G06F 13/16; G06F 3/0658; G06F 11/10; G06F 12/00; G06F 13/1668; G06F 13/1673; G06F 13/1694; G06F 3/068; Y02B 60/1228; G11C 16/10; G11C 16/26; G11C 2029/0411

USPC ............ 714/763, 764, E11.034, 52, 725, 718, 714/768, 799; 711/105, E12.008; 710/74
See application file for complete search history.

(56) References Cited

U.S. PATENT DOCUMENTS 5,918,068 A * 6/1999 Shafe' .............................. 710/11
6,828,822 B1 * 12/2004 Bellis et al. ..................... 326/38
7,490,209 B1 * 2/2009 Charagulla ................... 711/167

(Continued)

FOREIGN PATENT DOCUMENTS

EP 2610874 7/2013
WO 2007145883 12/2007

OTHER PUBLICATIONS

Stuecheli et al., The Virtual Write Queue: Coordinating DRAM and Last-Level Cache Policies, Jun. 19-23, 2010, ISCA'10, pp. 72-82.*

*Primary Examiner* — John J Tabone, Jr.
(74) *Attorney, Agent, or Firm* — Treyz Law Group, P.C.; Jason Tsai; Andrew C. Milhollin

(57) ABSTRACT

A programmable integrated circuit with memory interface circuitry is provided. The memory interface circuitry may include soft memory interface logic and hard memory interface logic. The soft memory interface logic may be implemented using programmable circuits, whereas the hard memory interface logic may be implemented using non-programmable dedicated circuits. The soft memory interface logic may include error correction code (ECC) encoder and decoder circuits and circuitry for carrying out a read modified write (RMW) operation. The hard memory interface logic may include a write data buffer, a read data buffer, and other circuitry for supporting the RMW operation. The soft memory interface logic is interposed between the hard memory interface logic and the user logic on the programmable integrated circuit.

20 Claims, 6 Drawing Sheets

(56) References Cited

U.S. PATENT DOCUMENTS

| | | |
|---|---|---|
| 8,099,564 B1 * | 1/2012 | Kulkarni et al. .............. 711/154 |
| 8,140,724 B1 * | 3/2012 | Yoon et al. ...................... 710/74 |
| 8,222,923 B1 * | 7/2012 | Shimanek et al. .............. 326/41 |
| 8,520,505 B1 | 8/2013 | Kruglick |
| 8,629,691 B2 | 1/2014 | Fitton et al. |
| 8,914,589 B2 * | 12/2014 | Gregorius et al. ............ 711/153 |
| 2009/0187689 A1 * | 7/2009 | Roohparvar .................. 710/100 |
| 2010/0131827 A1 * | 5/2010 | Sokolov et al. ............... 714/763 |
| 2012/0311277 A1 * | 12/2012 | Chu et al. ...................... 711/158 |
| 2013/0215069 A1 * | 8/2013 | Lee et al. ...................... 345/173 |
| 2014/0029369 A1 * | 1/2014 | Yamazaki et al. ........ 365/230.03 |

* cited by examiner

MEMORY INTERFACE WITH HYBRID ERROR DETECTION CIRCUITRY FOR MODULAR DESIGNS

BACKGROUND

Programmable integrated circuits are a type of integrated circuit that can be configured by a user to implement custom logic functions. In a typical scenario, a logic designer uses computer-aided design (CAD) tools to design a custom logic circuit. When the design process is complete, the CAD tools generate configuration data. The configuration data is loaded into a programmable integrated circuit to configure the device to perform desired logic functions.

In a typical system, a programmable integrated circuit, memory devices, and other electronic components are mounted on a printed circuit board. The programmable integrated circuit includes memory interface circuitry that is used to relay data back and forth between the programmable integrated circuit and the memory devices (i.e., the memory interface circuitry is used to read data from and write data into the memory devices). When performing such memory read and write operations, the timing and accuracy of control and data signals that are conveyed between the programmable integrated circuit and the memory devices are critical.

In order to support operations with a wide range of data widths, programmable integrated circuits have been provided with dedicated memory interface circuitry (sometimes referred to as "hard" memory interface circuits). The hard memory interface is organized into groups that are referred to as "tiles," each of which can be used to drive 48 input-output pins and is equipped with a set of memory controller logic and data buffers. Multiple tiles can be concatenated together to form interfaces having a wide range of data widths. For example, six tiles can be concatenated together to support a 144-bit memory interface. Even though multiple tiles can be configured to support different data widths, each individual tile is non-reconfigurable.

This implementation in which each memory interface tile is formed using only non-reconfigurable circuits requires that error detection and correction circuits be placed in every single tile. Since the error detection and correction circuits require that all data bits be present at the same time to perform encoding and decoding operations and that all data bits from associated neighboring tiles need to be routed to the local tile that is performing the encoding/decoding. This routing requirement results in a significant number of wires and consumes valuable routing space.

SUMMARY

This relates generally to integrated circuits and, more particularly, to integrated circuits operable to communicate with external (off-chip) memory. The integrated circuit may include programmable user logic, non-reconfigurable ("hard") memory interface logic, and reconfigurable ("soft") memory interface logic interposed between the hard memory interface logic and the user logic.

The soft memory interface logic may include an error correction code (ECC) encoder, an ECC decoder, a write ECC information generator, a read modified write (RMW) information buffer, and an RMW data merging circuit. The hard memory interface logic may include a write data buffer, a read data buffer, and a command buffer.

The user logic may output a memory access command (e.g., a write command or a read command) to the soft memory interface logic. When a write command is issued, write data and associated byte enable bits may be conveyed from the user logic to the soft memory interface logic. The write command may be temporarily stored in the command buffer. The write ECC information generator may analyze the byte enable bits and determine whether the write command is a full write command (e.g., if all the byte enable bits are asserted) or a partial write command (e.g., if at least one of the byte enable bits are deasserted).

For a full write, the encoder generates an ECC code word, which is then appended to the original write data and sent to the hard memory interface controller to complete the write operation. The partial write command may result in a read command being inserted before the write command in the command buffer. The RMW information buffer may receive the write data and store the write data. The RMW data merging circuit may retrieve the stored write data from the RMW information buffer, receive read data returned as a result of the inserted read command, and combine a portion of the stored write data with a portion of the read data to produce merged data. The write data buffer may receive the merged data and assert an enable signal. The asserted enable signal may allow the previously stored write command in the second command buffer to be executed so that the merged data is loaded into the external memory.

When a read command is issued, read data may be returned from the external memory. The ECC decoder may receive the read data and decode the read data to determine whether the read data contains any errors. In response to detecting an absence of errors, the read data can be returned to the user logic. In response to detecting a double bit error, the read data can be returned to the user logic, and an error flag bit may be asserted to alert the user logic to take further action to handle the double bit error (e.g., to perform a full device reconfiguration or to perform other corrective action).

In response to detecting a single bit error, the decoder may correct the single bit error to produce corrected read data (which is optionally returned to the user logic), and a dummy write command (e.g., a write command with associated byte enable bits that are all deasserted) may be issued. The hard memory interface logic may receive the dummy write command and may insert a read command before the dummy write command to generate a RMW command pair, both of which are stored in the command buffer. The inserted read command may direct the external memory to return additional read data. The ECC decoder may receive the additional read data and may regenerate the corrected read data. The ECC encoder in the soft memory interface logic may encode the regenerated corrected read data to produce a corresponding ECC code, which is then appended to the corrected read data to generate encoded read data. The encoded read data may then be written into the external memory to correct the detected single bit error.

Further features of the present invention, its nature and various advantages will be more apparent from the accompanying drawings and the following detailed description.

DETAILED DESCRIPTION

Embodiments of the present invention relate to integrated circuits that contain memory interface circuitry. It will be recognized by one skilled in the art, that the present exemplary embodiments may be practiced without some or all of these specific details. In other instances, well-known operations have not been described in detail in order not to unnecessarily obscure the present embodiments.

The memory interface circuitry may be used to interface with off-chip memory such as random-access memory (RAM). The integrated circuits may be digital signal processors, microprocessors, application specific integrated circuits, or other suitable integrated circuits. With one suitable arrangement, the integrated circuits that communicate with memory are programmable integrated circuits such as programmable logic device integrated circuits or other programmable integrated circuits that contain programmable circuitry. The programmable circuitry can be programmed using configuration data. Programmable integrated circuits are typically operated in a diverse set of system environments.

Figure 1:
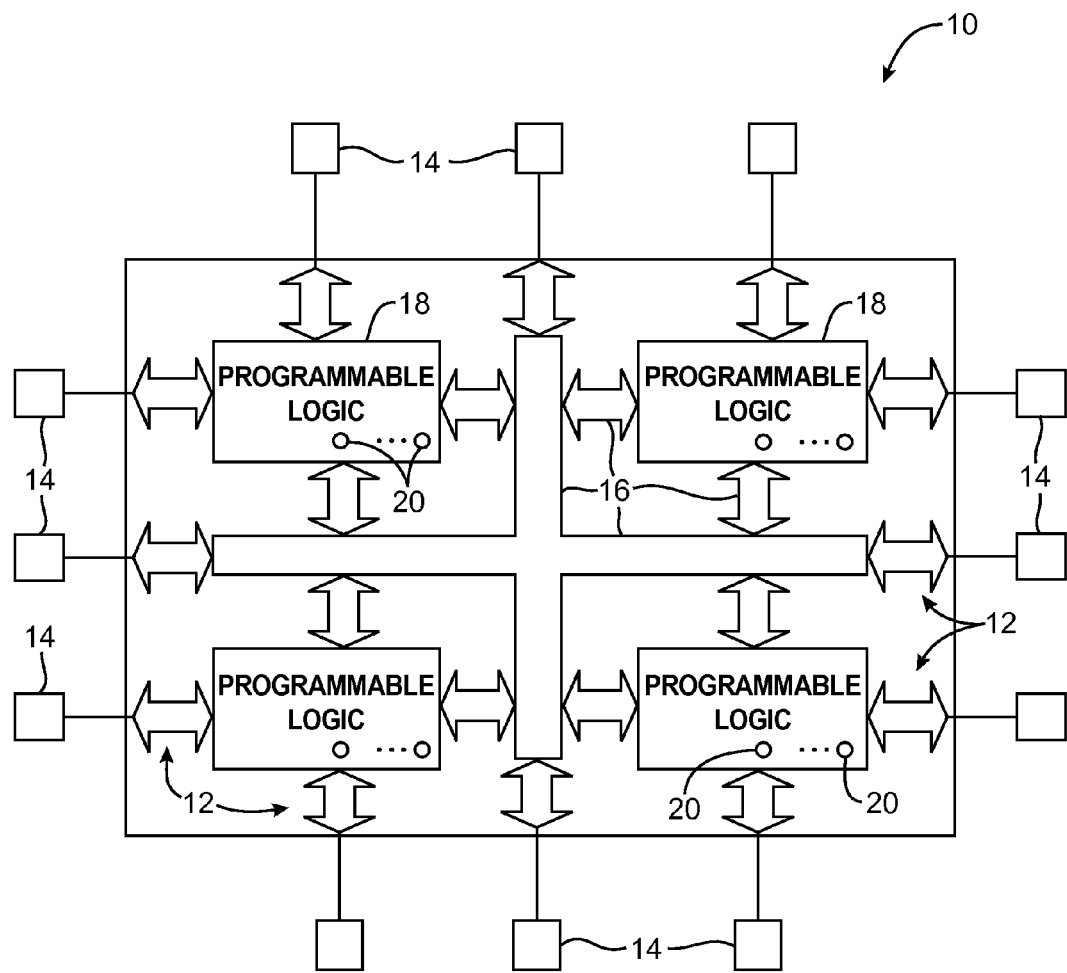
FIG. 1 is a diagram of an illustrative programmable integrated circuit in accordance with an embodiment.

FIG. 1 shows a diagram of an illustrative programmable integrated circuit. As shown in FIG. 1, device 10 may have input-output (I/O) circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. For example, programmable logic 18 may include look-up tables, registers, and multiplexers. The programmable logic 18 may be configured to perform a custom logic function. The programmable interconnects associated with interconnection resources may be considered to be a part of programmable logic 18.

Programmable logic 18 contains programmable elements 20. Programmable elements 20 may be based on any suitable programmable technology, such as fuses, antifuses, electrically-programmable read-only-memory technology, random-access memory cells, mask-programmed elements, etc. As an example, programmable elements 20 may be formed from memory cells. During programming, configuration data is loaded into the memory cells using pins 14 and input-output circuitry 12. The memory cells are typically random-access-memory (RAM) cells. Because the RAM cells are loaded with configuration data, they are sometimes referred to as configuration RAM cells (CRAM).

Programmable element 20 may be used to provide a static control output signal for controlling the state of an associated logic component in programmable logic 18. The output signals generated by elements 20 are typically applied to gates of metal-oxide-semiconductor (MOS) transistors (sometimes referred to as pass gate transistors).

The circuitry of device 10 may be organized using any suitable architecture. As an example, logic 18 of programmable device 10 may be organized in a series of rows and columns of larger programmable logic regions, each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Other device arrangements may use logic that is not arranged in rows and columns.

Figure 2:
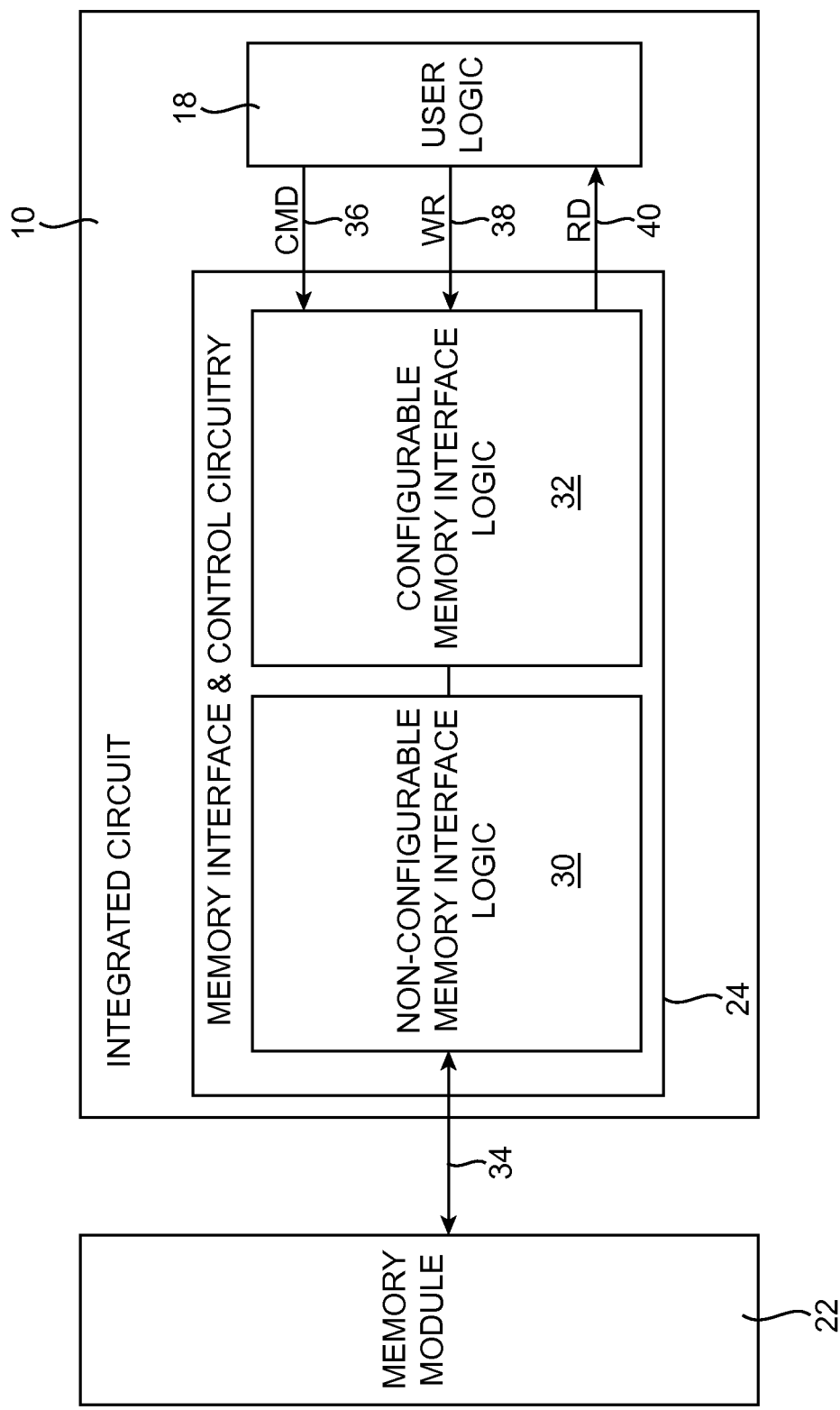
FIG. 2 is a diagram of illustrative memory interface circuitry in accordance with an embodiment.

Device 10 may communicate with off-chip memory such as memory module 22 (see, e.g., FIG. 2). Memory module 22 may be an external memory device sometimes referred to as a single in-line memory module (SIMM) or a dual in-line memory module (DIMM). Device 10 may be configured to communicate with at least two memory modules 22, at least four memory modules 22, etc. As shown in FIG. 2, device 10 may include memory interface and control circuitry 24 that serves to relay information between memory module 22 and user logic circuits 18 that are internal to device 10. Memory interface and control circuitry 24 is sometimes referred to as memory controller circuitry.

Memory interface circuitry 24 may include non-configurable memory interface logic 30, configurable memory interface logic 32, and other peripheral circuitry. Configurable memory interface logic 32 may include programmable circuits that can be reconfigured or reprogrammed depending on the current needs of the user and may sometimes be referred to as "soft" memory interface/controller logic. Non-configurable memory interface logic 30 may include dedicated circuits that serve to perform particular functions regardless of the needs of the user (e.g., circuits that are fixed and cannot be reconfigured or reprogrammed) and may sometimes be referred to as "hard" memory interface/controller logic.

As shown in FIG. 2, soft memory interface logic may be interposed between hard memory interface logic 30 and user logic 18. User logic 18 may send memory access commands to soft memory interface logic 32 via path 36. Depending on the type of command being issued, circuitry 24 may be used to perform a memory write or read operation. During memory write operations, user logic 18 may provide write data signals to soft memory interface logic 32 via path 38. The write data signals and associated data strobe, clock, and address signals may then be sent from hard memory interface logic 30 to memory module 22 over path 34. The address signals may serve to specify the address (e.g., a selected bank address in memory device 22) to which data is written during write operations and the address from which data is read out during read operations. During memory read operations, data retrieved from memory module 22 may be conveyed from memory module 22 to hard memory interface logic 30 via path 34. The read data may then be sent from the soft memory interface logic 32 to user logic 18 over path 40.

Memory interface and control circuitry 24 may also serve to perform desired data rate conversions and to generate signals that meet timing requirements specified by the memory protocol currently under use. The arrangement of FIG. 2 is merely illustrative and is not intended to limit the scope of the present invention. Integrated circuits other than programmable integrated circuits may include memory interface circuitry 24 that is used to communicate with one or more memory modules 22.

In accordance with an embodiment, memory interface and control circuitry 24 may be provided with error detection and correction capabilities. In particular, circuitry 24 may include error correction code (ECC) circuitry that is implemented using a mixture of both soft and hard logic (e.g., soft memory interface logic 32 and hard memory interface logic 30). ECC circuitry that is implemented using both soft and hard logic may be referred to as "hybrid" ECC circuitry. In order to implement ECC, circuitry 24 may include at least an encoder, a decoder, and read-modified-write (RMW) control circuitry. This hybrid implementation leverages the flexibility provided by the soft/programmable memory interface logic, which eliminates the need to route redundant ECC encoders and decoders, as required in the conventional tiled design (e.g., ECC logic is added only when needed).

An RMW operation (e.g., a read or write operation that involves retrieving data from external memory and loading data into the external memory) should be performed when: (1) a partial write operation is issued and (2) a read return is detected to exhibit a single bit error. During a partial write, a read is inserted before the actual write to retrieve the original bits from external memory 22. The partial write data may be merged with a portion of the read data to generate a new ECC code word; the resulting information can then be written to memory 22. When read data is detected to have a single bit error, an additional write operation is issued to load corrected data along with associated ECC bits back to memory 22 to keep the memory contents healthy.

Soft memory interface logic 32 contains the encoder, decoder, and a portion of the RMW control circuitry. Any remaining portion of the RMW control circuitry and other control logic used to support this hybrid ECC scheme are included in the hard memory interface logic 30. Details of how the soft and hard memory interface logic can be used to perform read and write operations are described below.

Figure 3:
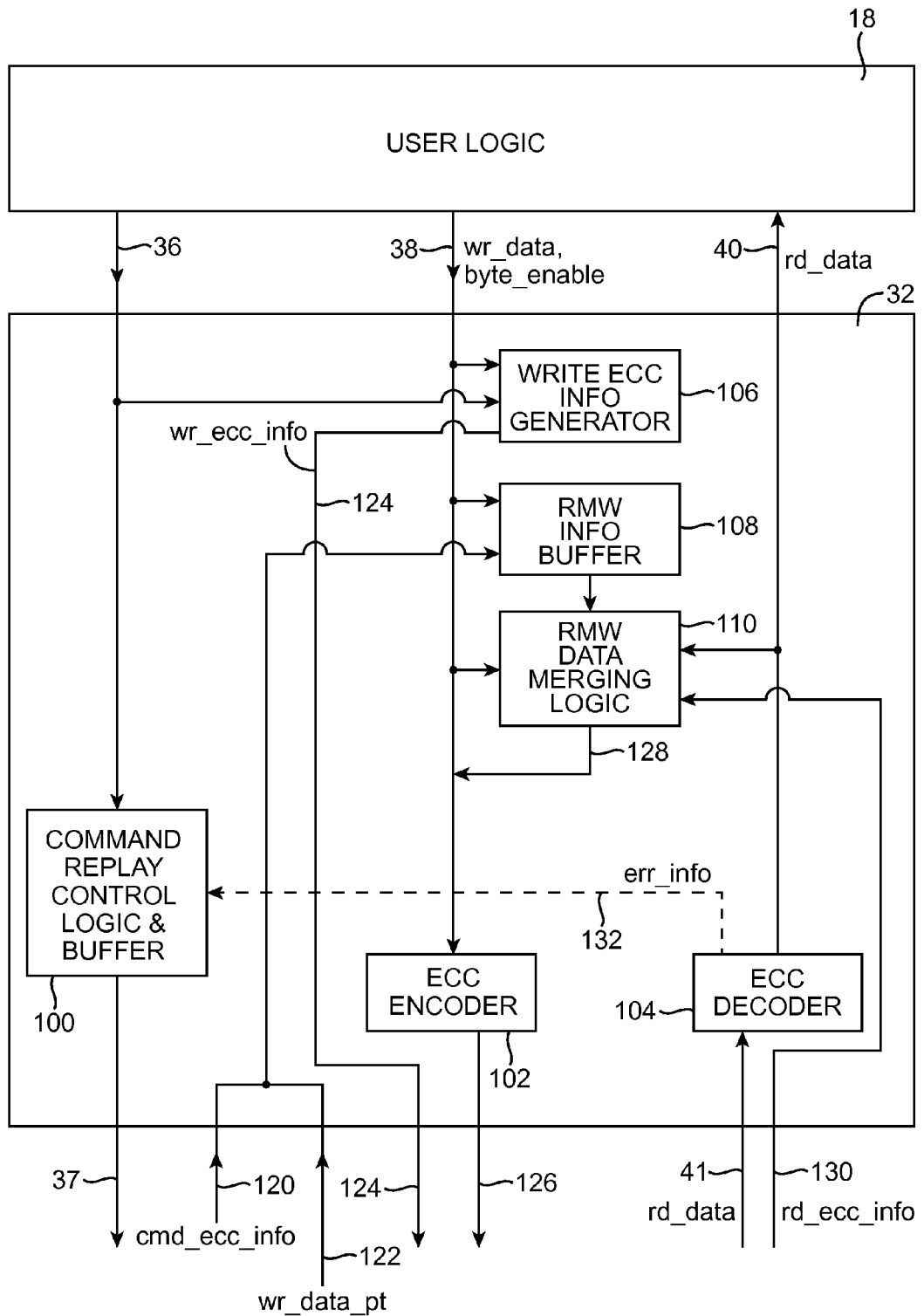
FIG. 3 is a diagram of configurable memory interface logic circuits in accordance with an embodiment.

FIG. 3 is a diagram showing one suitable arrangement of soft memory interface logic 32. As shown in FIG. 3, logic 32 may include command replay control logic and buffer 100, an ECC encoder 102, an ECC decoder 104, a write ECC info generator 106, an RMW info buffer 108, and an RMW data merging logic circuit 110. Command replay control logic and buffer 100 may have an input operable to receive a command from user logic 18 via path 36 and an output on which a stored command is provided to the hard memory interface logic via path 37.

Encoder 102 may have an input operable to receive write data (wr_data) and associated byte enable signals (byte_enable) from user logic 18 via path 38. The byte enable signals are used to indicate whether the current write operation is a full write or a partial write. For example, a byte_enable with all logic "1" (active) bits may indicate a full write, whereas a byte_enable with at least some logic "0" (disabled) bits may indicate a partial write. Encoder 102 may also have an output on which wr_data and byte_enable is provided to the hard memory interface logic via path 126.

Decoder 104 may have an input operable to receive read data (rd_data) from the hard memory interface logic via path 41, a first output on which rd_data is provide to user logic 18 via path 40, and a second output on which error information (err_info) is provide to command replay control logic 100 via dotted path 132. The err_info may indicate the type of error that has been detected in the rd_data. For example, the err_info may include an error flag that is deasserted when no error is detected. If no error is detected, rd_data is simply provided to user logic 18, and a previously stored command in buffer 100 should be retired/deleted. Buffer 100 may retire the previously stored command upon receiving appropriate err_info from decoder 104.

The error flag may be asserted when a two-bit error is detected. If a two-bit error is detected, the data is returned to user logic 18, a previously stored command in buffer 100 should be retired, and the user is made aware of the presence of the multi-bit error so that further action can be taken.

The error flag may also be asserted when a single-bit error is detected. If desired, the error flag may be a two-bit signal having different values to differentiate between a two-bit error and a single-bit error. If a single-bit error is detected, decoder 104 may be used to correct the erroneous bit and send the corrected data back to user logic 18. Other actions such as retrieving the stored command from buffer 100, issuing a dummy write, and performing a RMW operation associated with the single-bit error scenario are described in further detail below. In this example, it is assumed that decoder 104 can only correct single-bit errors. If desired, decoder 104 that can correct multi-bit errors can also be used in soft memory interface logic 32.

Write ECC info generator 106 has a first input operable to receive wr_data and byte_enable via path 38, a second input operable to receive the user command via path 36, and an output on which write ECC information (wr_ecc_info) is provided to hard memory interface logic 30 via path 124. Generator 106 may output wr_ecc_info that contains information reflective of whether a "normal" write with ECC disable is issued, a full write with ECC enabled is issued, a partial write with ECC enabled is issued, a dummy write (e.g., a write operation with all byte enable bits deasserted) is issued, the current wr_data represents normal write data or merged data, etc.

RMW info buffer 108 may have a first input operable to receive wr_data and byte_enable via path 38 and a second input operable to receive command ECC information (cmd_ecc_info) and a write data point (wr_data_pt) from hard memory interface logic 30 via paths 120 and 122, respectively. The cmd_ecc_info may contain information indicative of whether a write command has been loaded and whether the write command requires a RMW operation. The wr_data_pt addresses the location at which the current wr_data is being stored in a write buffer in hard memory interface logic 30. The information provided at the first and second inputs of buffer 108 can be temporarily stored in RMW info buffer 108. Buffer 108 may have an output on which stored information can be sequentially provided to RMW data merging logic circuit 110.

RMW data merging logic circuit 110 may have a first input that receives information from buffer 108, a second input that receives rd_data via path 40, a third input that receives read ECC information (rd_ecc_info) from hard memory interface logic 30 via path 130, and a fourth input that receives wr_data from user logic 18 via path 38. The received rd_ecc_info may contain information reflective of whether a "normal" write with ECC disable is issued, a full write with ECC enabled is issued, a partial write with ECC enabled is issued, a dummy write is issued, the current rd_data represents normal return or a RMW return, etc. Based on the information received at its input, data merging logic 110 may produce merged data at its output 128 (e.g., by merging previously stored write data signals with a portion of the read data signals). The merged data can then be fed to ECC encoder 102 for further processing.

Figure 4:
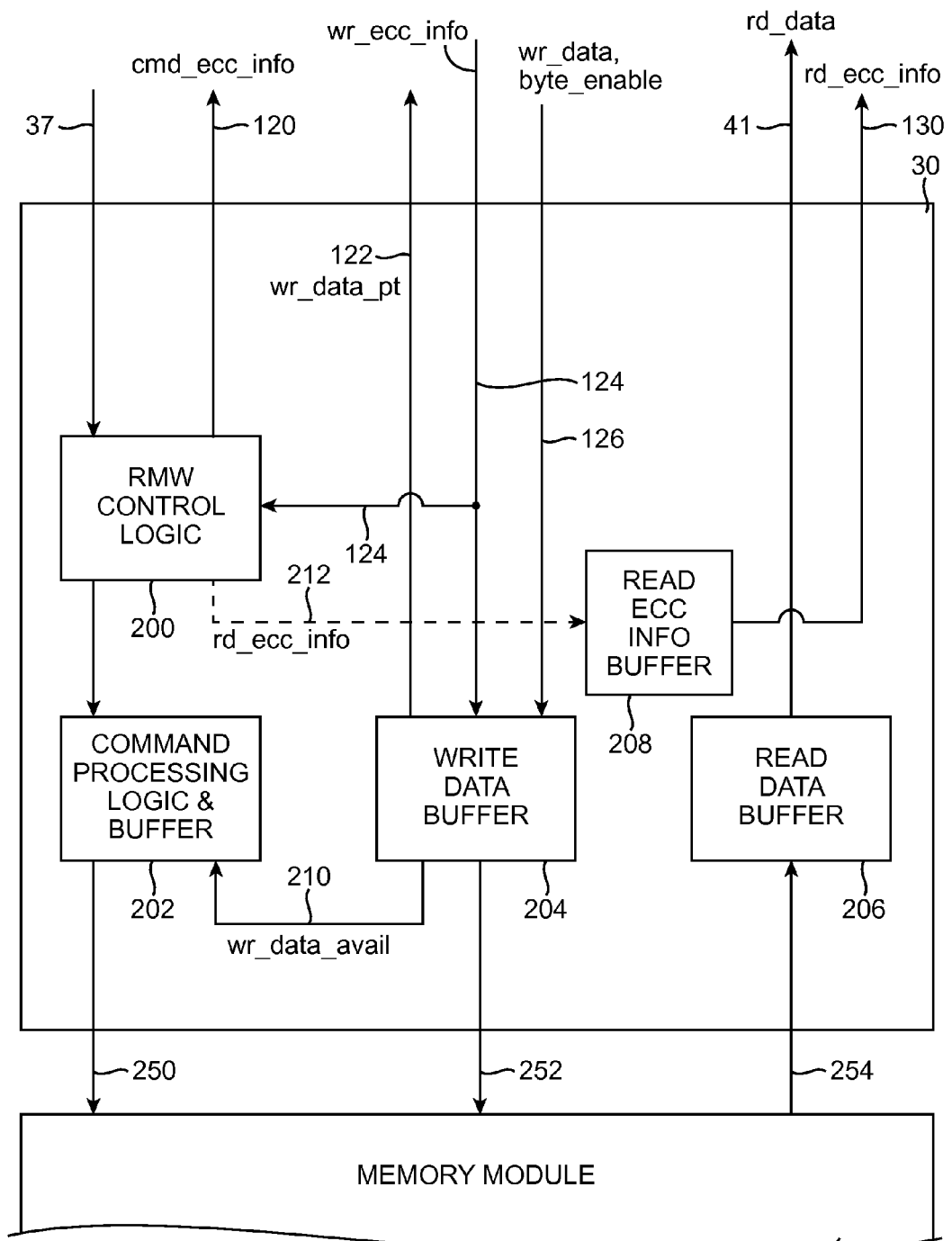
FIG. 4 is a diagram of non-configurable memory interface logic circuits in accordance with an embodiment.

FIG. 4 is a diagram showing one suitable arrangement of hard memory interface logic 30. As shown in FIG. 4, logic 30 may include at least a hard RMW control logic circuit 200, command processing logic and buffer 202, a write data buffer 204, a read data buffer 206, and a read ECC info buffer 208. Read data buffer 206 may have an input that receives return data from memory module 254 and an output on which stored return data is sequentially provided to soft memory interface logic 32 via path 41.

Hard RMW control logic circuit 200 has a first input operable to receive the user command from soft memory interface logic 32 via path 37 and a second input operable to receive the wr_ecc_info from soft memory interface logic 32 via path 124. Based on the received information, RMW control logic circuit 200 generates at its first output cmd_ecc_info that is provided to soft memory interface logic 32 via path 120 and at its second output rd_ecc_info that is provided to read ECC info buffer 208 via dotted path 212. Read ECC info buffer 208 may temporarily store any rd_ecc_info generated by RMW control logic circuit 200 and sequentially output stored rd_ecc_info to soft memory interface logic 32 via path 130.

The user command on path 37 may be passed through to command processing logic and buffer 202 via circuit 200. Command buffer 202 may temporarily store the user commands. For example, any read command may be passed on directly to memory module 22 via path 250. On the other hand, write commands may only be passed on to memory module 22 when a write data available signal (wr_data_avail on path 210) that is generated by write data buffer 204 is asserted (e.g., buffer 202 will hold on to the write command when wr_data_avail is deasserted and may release the held write command to memory 22 when wr_data_avail is asserted). Wr_data_avail therefore serves as an enable signal that, when asserted, allows command buffer 202 to release the stored command.

Write data buffer 204 may have a first input operable to receive wr_data and byte_enable from soft memory interface logic 32 via path 126 and a second input operable to receive wr_ecc_info from soft memory interface logic 32 via path 124. Based on the information received at its input, write data buffer 204 may be used to store the wr_data at a selected location, to output a write data pointer corresponding to the selected location (e.g., wr_data_pt generated on path 122), and to output wr_data_avail to circuit 202. Write data buffer 204 may output stored write data to memory module 22 via path 252 only when wr_data_avail is asserted.

The circuits shown in FIGS. 3 and 4 are merely illustrative and do not limit the scope of the present invention. If desired, soft memory interface logic 32 and hard memory interface logic 30 may include other circuitry for implementing the RMW control and ECC encoding/decoding. In other suitable arrangements, some portions of soft memory interface logic 32 may be moved into hard memory interface logic 30, whereas other portions of hard memory interface logic 30 may be formed as part of soft memory interface logic 32.

Figure 5:
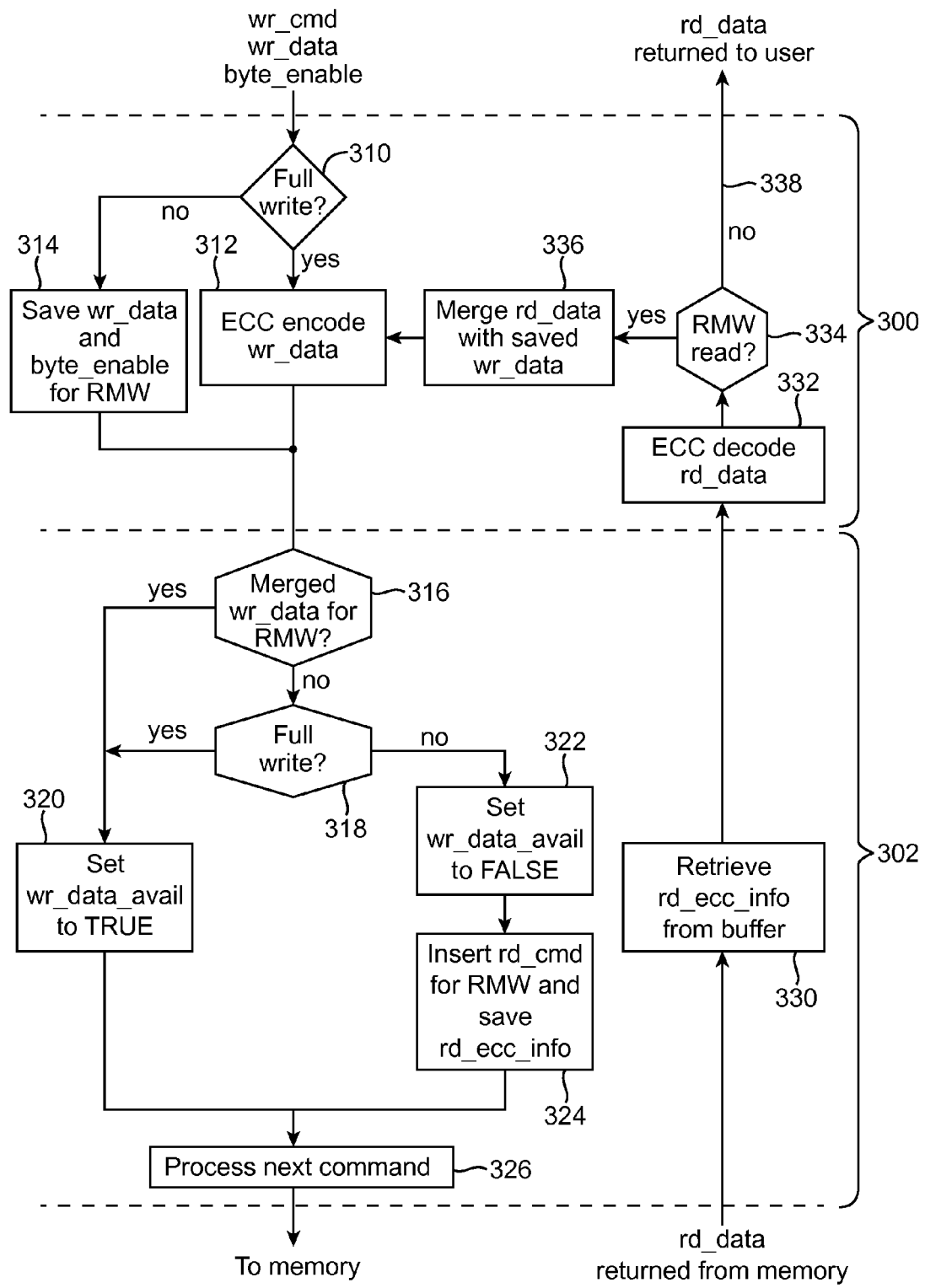
FIG. 5 is a flow chart of illustrative steps involved in performing a memory write operation using the memory interface circuitry of FIG. 2 in accordance with an embodiment.

FIG. 5 is a flow chart of illustrative steps involved in using the soft and hard memory interface logic circuitry of FIGS. 3 and 4 to perform a write operation. Steps performed in portion 300 of FIG. 5 may represent operations performed using the circuits within soft memory interface logic 32, whereas steps performed in portion 302 of FIG. 5 may present operations performed using the circuits within hard memory interface logic 30.

During a write operation, user logic 18 may send a write command (wr_cmd), wr_data, and byte_enable to soft memory interface logic 32. At step 310, write ECC info generator 106 may be used to detect if all the byte_enable bits are active (i.e., if all the byte_enable bits are asserted). If a full write is detect (e.g., if all the byte enable bits are active), ECC encoder 102 may generate an ECC code word and append the code word to wr_data (step 312). If a partial write is detected (e.g., if at least one of the byte enable bits is deasserted), wr_data and byte_enable are saved in RMW info buffer 108 for later RMW merge (step 314). Write ECC info generator 106 may output corresponding wr_ecc_info containing information whether the current write operation requires a RMW to be performed and whether the current wr_data represents merged write data or normal (unmerged) write data. The wr_ecc_info, wr_cmd, and wr_data (along with the associated byte_enable) may then be provided from soft memory interface logic 32 to hard memory interface logic 30 via paths 124, 37, and 126, respectively (see, FIG. 3).

At step 316, write data buffer 204 may inspect wr_ecc_info to determine whether wr_data represents merged data for RMW or normal/unmerged data. In response to detecting merged write data, write data buffer 204 may set wr_data_avail to TRUE (e.g., the write data buffer may assert wr_data_avail at step 320 to allow wr_data to be released to the memory module). In response to detecting normal data, write data buffer 204 may again determine whether the current write operation is a full write command. If a full write is detected, step 320 may be performed. If a partial write is detected, write data buffer 204 may set wr_data_avail to FALSE (e.g., the write data buffer may deassert wr_data_avail at step 322 to hold on to the write data).

At step 324, a read command (rd_cmd) may be inserted before the wr_cmd in buffer 202 for a RMW and a corresponding rd_ecc_info generated by RMW control logic 200 may be saved in read ECC info buffer 208. Meanwhile, write data buffer 204 may assign a wr_data_pt for the slot in which the current write data is being stored and the wr_data_pt is sent back to the soft memory interface logic to be stored in RMW info buffer 108.

Either step 320 or 324 will proceed to step 326. At step 326, the first command in command buffer 202 may be processed (e.g., the next command in the command pipeline 202 may be sent to memory module 22 via path 250). At this time, the rd_cmd that has been inserted at the front of buffer 202 may be executed. In response to executing the rd_cmd, rd_data may be returned from the external memory. At step 330, rd_ecc_info indicating that the current rd_data is associated with a RMW read may be retrieved from buffer 208.

The rd_data and rd_ecc_info may then be provided from hard memory interface logic 30 to soft memory interface logic 32 via paths 41 and 130, respectively. At step 332, ECC decoder 104 may decode the rd_data. At step 334, RMW data merging logic 110 may determine whether the current read data is an RMW read data (e.g., by checking the cmd_ecc_info or the rd_ecc_info). If the current read data is not associated with a RMW, the rd_data is optionally returned to user logic 18. If the current read data is read back via a RMW operation, RMW data merging logic 110 combines a portion of rd_data with a portion of the wr_data stored in RMW info buffer 108 to produced merged data (step 336). Processing then proceeds to step 312, as described above.

At this point, ECC encoder 102 may generate a new ECC code for the merged data. The merged data, the newly generated ECC code (which may be appended to the merged data), wr_data_pt, and a wr_ecc_info indicating that the current write data represented merged data are all sent to the hard memory interface logic. The merged data will overwrite the existing data in write buffer 204 at the location specified by wr_data_pt. This time around, wr_data_avail will be set to TRUE (step 320) and the previously stored wr_cmd in buffer 202 is then executed to complete the write operation.

Figure 6:
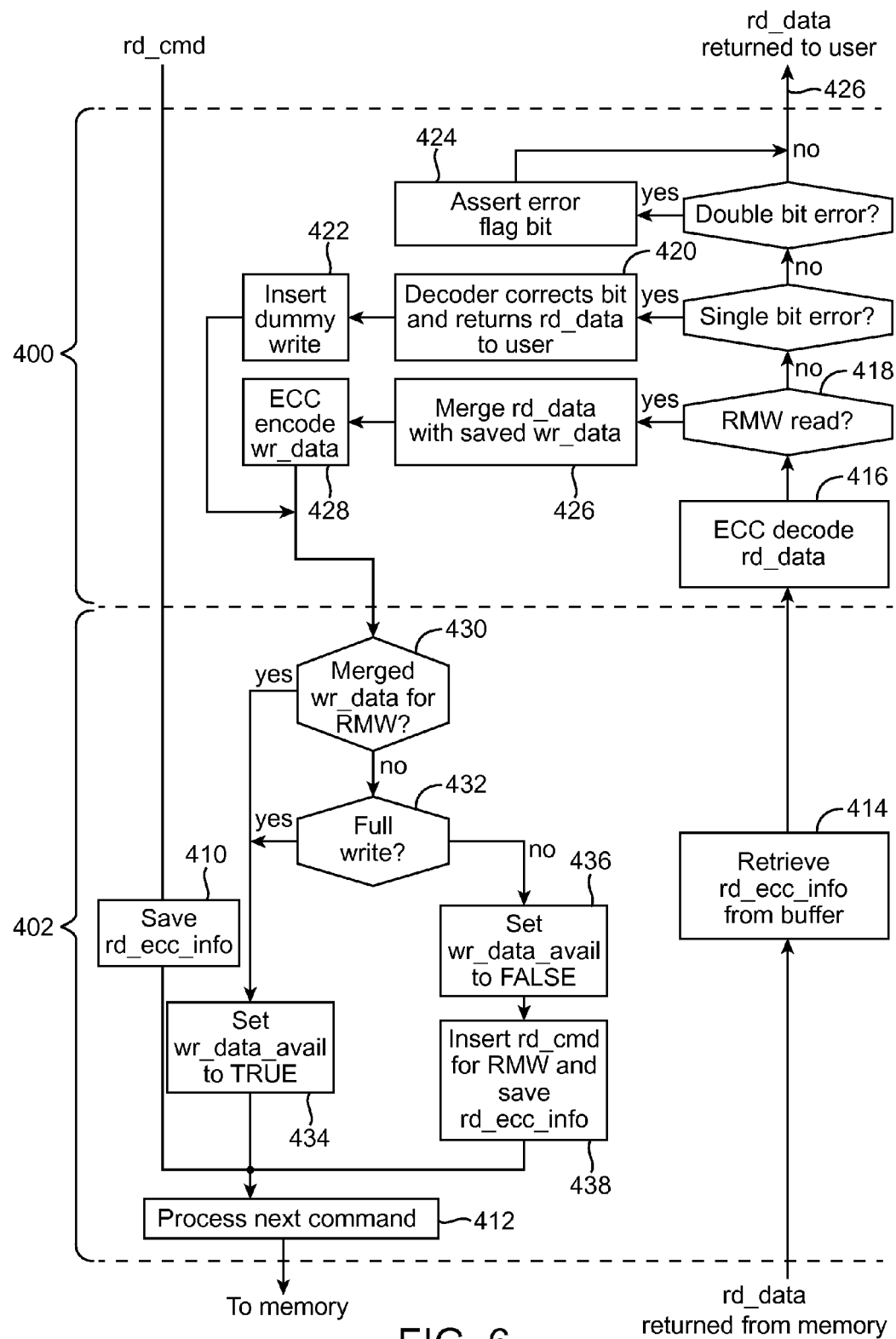
FIG. 6 is a flow chart of illustrative steps involved in performing a memory read operation using the memory interface circuitry of FIG. 2 in accordance with an embodiment.

FIG. 6 is a flow chart of illustrative steps involved in using the soft and hard memory interface logic circuitry of FIGS. 3 and 4 to perform a read operation. Steps performed in portion 400 of FIG. 6 may represent operations performed using the circuits within soft memory interface logic 32, whereas steps performed in portion 402 of FIG. 6 may present operations performed using the circuits within hard memory interface logic 30.

During a read operation, user logic 18 may send a read command (rd_cmd) to soft memory interface logic 32. The rd_cmd may be passed through the soft memory interface logic to the hard memory interface logic without any change. The rd_cmd may be stored in command replay buffer 100 in the soft memory interface logic for later error correction.

At step 410, RMW control logic 200 in hard memory interface logic 30 may generate rd_ecc_info, which is then stored in read ECC info buffer 208. The rd_cmd is passed through command processing logic and buffer 202 to the external memory module to execute the read operation (at step 412). In response to executing the rd_cmd, rd_data may be returned from the external memory. At step 414, rd_ecc_info indicating that the current rd_data is a normal read return (e.g., the current rd_data is not an RMW read return) may be retrieved from buffer 208.

The rd_data and rd_ecc_info may then be provided from hard memory interface logic 30 to soft memory interface logic 32 via paths 41 and 130, respectively. At step 416, ECC decoder 104 may decode the rd_data. At step 418, RMW data merging logic 110 may determine whether the current read data is RMW read data (e.g., by analyzing the cmd_ecc_info or the rd_ecc_info). Since the current rd_data is a normal read return, ECC decoder 104 may determine whether the rd_data contains any errors. If no error is detected, rd_data is simply provided to user logic 18 via path 426. If a double bit error is detected, rd_data is also returned to user logic 18 while an error flag is asserted to alert the user to take further action to handle the double bit error (step 424). In either case (i.e., when no error is detected or when a two bit error is detected), the previously stored rd_cmd in command replay buffer 100 is retired.

When a single bit error is detected, ECC decoder 104 corrects the erroneous bit and sends the corrected data back to user logic 18 (step 420). At step 422, the previously stored rd_cmd from command reply buffer 100 and changes that command to a "dummy" write command (e.g., a write operation with all byte_enable bits deasserted). From this point on, the write operation as described in connection with FIG. 5 follows. In particular, steps 430, 432, 434, 436, 438, 418, 426, and 428 in FIG. 6 correspond to steps 316, 318, 320, 322, 324, 334, 336, and 312 in FIG. 5, respectively.

In summary, the dummy write is converted into a RMW read and write command pair, and once the converted read and write command pair has been executed, the memory content should be corrected. For example, a read command may be inserted in front of the dummy write. Additional read data returned as a result of the inserted read command will again be corrected by the ECC decoder to provide a corrected read data. The corrected read data will overwrite any existing write data upon merging (since all byte enable bits are deasserted for the dummy write). The corrected read data (or merged data) is then encoded by the ECC encoder to generate a new ECC code, which can then be appended to the merged data. The merged data is then written back into the external memory. The RMW operation (e.g., an inserted re-read immediately followed by a write with corrected data) ensures that there are no other commands after the initial read command and thereby avoids any potential memory access hazard.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit, comprising:
   user logic circuitry configured to implement a custom function;
   non-programmable memory interface logic that communicates with external memory; and
   programmable memory interface logic interposed between the non-programmable memory interface logic and the user logic circuitry.

2. The integrated circuit defined in claim 1, wherein the programmable memory interface logic comprises:
   an error correction code (ECC) encoder; and
   an error correction code (ECC) decoder.

3. The integrated circuit defined in claim 2, wherein the programmable memory interface logic further comprises:
   a command buffer configured to receive a command from the user logic circuitry and to receive an error flag from the ECC decoder.

4. The integrated circuit defined in claim 1, wherein the programmable memory interface logic comprises:
an error correction code (ECC) information generator configured to receive a command, write data, and write enable bits from the user logic circuitry and to output corresponding ECC information associated with the command.

5. The integrated circuit defined in claim 4, wherein the programmable memory interface logic further comprises:
a read modified write (RMW) information buffer configured to receive the write data and the write enable bits from the user logic circuitry and to store the write data; and
a read modified write (RMW) data merging circuit configured to receive the stored write data from the RMW information buffer, to receive read data retrieved from the external memory, and to output merged data by combining a portion of the stored write data with a portion of the retrieved read data.

6. The integrated circuit defined in claim 1, wherein the non-programmable memory interface logic comprises:
a write data buffer that receives write data and associated write error correction code (ECC) information from the programmable memory interface logic; and
a read data buffer that provides read data to the programmable memory interface logic.

7. The integrated circuit defined in claim 6, wherein the non-programmable memory interface logic further comprises:
a read modified write (RMW) control logic circuit that receives a command and the write ECC information from the programmable memory interface logic and that outputs read error correction code (ECC) information associated with a read command issued by the user logic circuitry; and
a read error correction code (ECC) information buffer that stores the read ECC information output from the RMW control logic circuit.

8. The integrated circuit defined in claim 7, wherein the non-programmable memory interface logic further comprises:
a command buffer that receives an enable signal from the write data buffer and that receives and stores the command output from the RMW control logic circuit, wherein the command buffer releases the stored command to the external memory only when the enable signal is asserted.

9. A method for operating an integrated circuit that communicates with memory, wherein the integrated circuit includes user logic, reconfigurable memory controller logic, and non-reconfigurable memory controller logic, the method comprising:
with the user logic, outputting a memory access command to the reconfigurable memory controller logic;
with the reconfigurable memory controller logic, receiving the memory access command from the user logic and outputting the memory access command to the non-reconfigurable memory controller logic; and
with the non-reconfigurable memory controller logic, receiving the memory access command from the reconfigurable memory controller logic and accessing the memory based on the received memory access command.

10. The method defined in claim 9, wherein the reconfigurable memory controller logic includes an error correction code (ECC) encoder and an error correction code (ECC) decoder, the method further comprising:
with the reconfigurable memory controller logic, receiving write data from the user logic;
with the ECC encoder, encoding the write data;
with the non-reconfigurable memory controller logic, receiving read data from the memory; and
with the ECC decoder, decoding the read data.

11. The method defined in claim 9, further comprising:
with the reconfigurable memory controller logic, receiving a write command, write data, and associated byte enable bits from the user logic; and
with the reconfigurable memory controller logic, determining that the write command is a full write command when all the byte enable bits are asserted and that the write command is a partial write command when at least one of the byte enable bits is deasserted.

12. The method defined in claim 9, wherein the reconfigurable memory controller logic includes a read modified write (RMW) information buffer and a read modified write (RMW) data merging circuit, the method further comprising:
with the RMW information buffer, receiving write data from the user logic and storing the write data; and
with the RMW data merging circuit, receiving the stored write data from the RMW information logic and read data from the non-reconfigurable memory controller logic and combining a portion of the stored write data with a portion of the read data to produce merged data.

13. The method defined in claim 12, wherein the reconfigurable memory controller logic includes an error correction code (ECC) encoder, the method further comprising:
with the ECC encoder, encoding the merged data and outputting the encoded merged data to the non-reconfigurable memory controller logic; and
with the non-reconfigurable memory controller logic, receiving the encoded merged data from the ECC encoder in the reconfigurable memory controller logic and loading the encoded merged data into a desired location in the memory.

14. The method defined in claim 9, wherein the non-reconfigurable memory controller logic includes a write data buffer and a command buffer, the method comprising:
with the write data buffer, outputting an enable signal to the command buffer; and
with the command buffer, receiving a write command from the reconfigurable memory controller logic, storing the write command, and sending the write command to the memory only when the enable signal is asserted.

15. The method defined in claim 9, wherein the non-reconfigurable memory controller logic includes a read modified write (RMW) control circuit, the method further comprising:
with the RMW control circuit, receiving a write command from the reconfigurable memory controller logic; and
in response to determining that write command is a partial write using the RMW control circuit, inserting a read command before the write command.

16. A method of operating an integrated circuit that communicates with off-chip memory, wherein the integrated circuit includes programmable user logic, soft memory interface logic, and hard memory interface logic, the method comprising:
with the hard memory interface logic, receiving a read command from the programmable user logic and forwarding the read command to the off-chip memory;

with the hard memory interface logic, receiving corresponding read data from the off-chip memory and forwarding the read data to the soft memory interface logic; and with an error decoding circuit in the soft memory interface logic, receiving the read data from the hard memory interface logic and decoding the received read data.

17. The method defined in claim 16, further comprising:

in response to detecting no errors in the read data using the error decoding circuit, returning the read data to the programmable user logic; and in response to detecting a double bit error in the read data using the error decoding circuit, returning the read data to the programmable user logic and asserting an error flag bit to alert the programmable user logic to take further action to handle the double bit error.

18. The method defined in claim 16, further comprising:

in response to detecting a single bit error in the read data using the error decoding circuit, correcting the single bit error and issuing a dummy write command with associated byte enable bits that are all deasserted.

19. The method defined in claim 18, further comprising:

with the hard memory interface logic, receiving the dummy write command and inserting a read command in front of the dummy write command.

20. The method defined in claim 19, further comprising:

with the hard memory interface logic, receiving additional read data corresponding to the inserted read command from the off-chip memory and forwarding the additional read data to the error decoding circuit;

with the error decoding circuit, generating corrected read data by correcting the additional read data;

with an error encoding circuit in the soft memory interface logic, encoding the corrected read data to generate a code word, appending the code word to the corrected read data to produce encoded read data, and forwarding the encoded read data to the hard memory interface logic; and with the hard memory interface logic, receiving the encoded read data from the error encoding circuit and writing the encoded read data into the off-chip memory.

\* \* \* \* \*